United States Patent
Kimura

(10) Patent No.: US 6,218,728 B1
(45) Date of Patent: *Apr. 17, 2001

(54) MOLD-BGA-TYPE SEMICONDUCTOR DEVICE AND METHOD FOR MAKING THE SAME

(75) Inventor: Naoto Kimura, Kumamoto (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/179,154

(22) Filed: Oct. 26, 1998

(30) Foreign Application Priority Data

Oct. 28, 1997 (JP) .......................................... 295305

(51) Int. Cl.$^7$ .................................................. H01L 23/48
(52) U.S. Cl. ......................... 257/693; 257/673; 257/696; 257/738; 257/778; 257/784
(58) Field of Search ........................... 257/784, 690–697, 257/737, 738, 780, 781, 666, 673, 778, 787

(56) References Cited

U.S. PATENT DOCUMENTS

| | | | |
|---|---|---|---|
| 5,311,057 | * | 5/1994 | McShane ............................ 257/784 |
| 5,528,083 | * | 6/1996 | Malladi et al. ...................... 257/784 |
| 5,659,952 | * | 8/1997 | Kovac et al. ........................ 257/668 |
| 5,674,785 | * | 10/1997 | Akram et al. ......................... 438/15 |
| 5,841,191 | * | 11/1998 | Chia et al. ............................ 257/690 |
| 5,864,174 | * | 1/1999 | Yamada et al. ...................... 257/676 |
| 6,001,723 | * | 12/1999 | Kelkar et al. ........................ 438/612 |
| 6,028,356 | * | 2/2000 | Kimura ................................ 257/730 |
| 6,107,682 | * | 8/2000 | Fjelstad .............................. 257/693 |

FOREIGN PATENT DOCUMENTS 3-94438   4/1991  (JP) .
8-204062  8/1996  (JP) .

* cited by examiner

Primary Examiner—Steven Loke
Assistant Examiner—Ori Nadav

(57) ABSTRACT

Disclosed is a mold-BGA-type semiconductor device which has: a semiconductor chip which includes insulating resin film formed on at least a part of the surface of the semiconductor chip except a pad; a conductive layer formed in a region on the insulating resin film, the region including at least part corresponding to a position where a solder ball is mounted; a first metal thin wire which is wire-bonded between the pad and the conductive layer; a second metal thin wire which is wire-bonded on the conductive layer; resin part which seals the semiconductor chip, the resin part including a hole to expose part of the second metal thin wire; and a solder ball which is mounted on the hole.

4 Claims, 4 Drawing Sheets

CENTER-PAD STRUCTURE

PERIPHERAL-PAD STRUCTURE

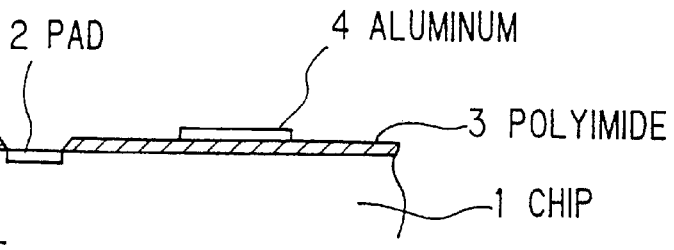
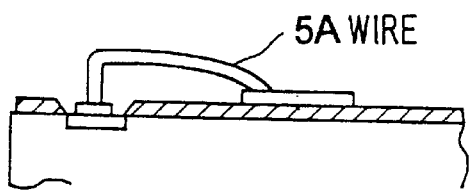
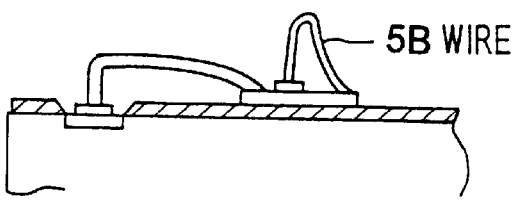
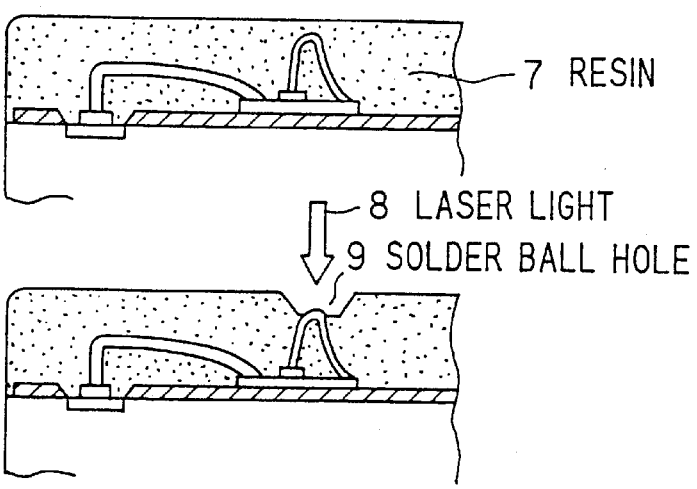
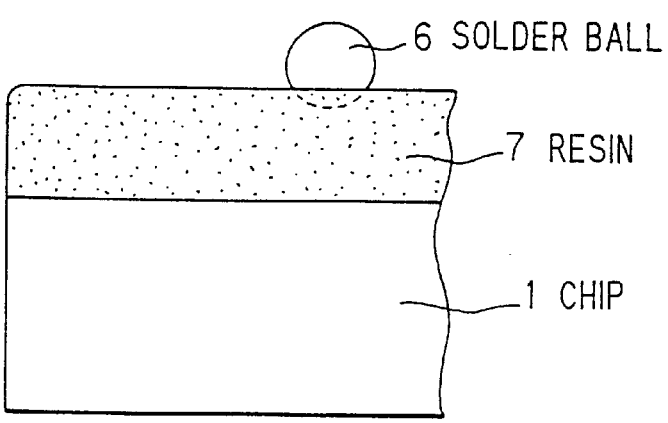

MOLD-BGA-TYPE SEMICONDUCTOR DEVICE AND METHOD FOR MAKING THE SAME

FIELD OF THE INVENTION

This invention relates to a mold-BGA (ball grid array)-type semiconductor device and a method for making the same. BGA means to connect arranging an array of ball solders on a main plane of substrate.

BACKGROUND OF THE INVENTION

A conventional mold-BGA-type semiconductor device is, as shown in FIGS. 1A and 1B, structured by adhering a buffering elastic material called elastomer 10 onto the surface of a chip 1, thermo-compression-bonding a copper wiring 12 to a pad 2 of the chip 1, sealing with a sealant 13. FIG. 1A shows a state that the pad 2 is disposed at the center of the chip 1, and FIG. 1B shows a state that it is disposed peripherally.

Also, Japanese patent application laid-open Nos. 3-94438 (1991) and 8-204062 (1996) disclose examples of mold-BGA-type semiconductor devices where solder balls are disposed on the surface of resin package on the front-face side of semiconductor chip.

As one example of them, the semiconductor device disclosed in Japanese patent application laid-open No. 3-94438 (1991) is shown in FIGS. 2A and 2B. FIG. 2A is a cross sectional view showing the semiconductor device before forming the solder balls, and FIG. 2B is a cross sectional view showing the semiconductor device after forming the solder balls.

As shown in FIG. 2A, it is fabricated by forming a dummy support 15 uniting with a die pad 14 on which a semiconductor chip 1 is to be mounted, adhering the semiconductor chip 1 onto the die pad 14, bonding between the pad 2 of the semiconductor chip 1 and the dummy support 15 through a wire 5 (metal thin wire), resin-sealing the whole members. After resin-sealing, as shown in FIG. 2B, outsides from the line B-B' and line C-C' in FIG. 2A are cut down and separated, thereby allowing part where the semiconductor chip 1 is mounted to be remaining. The surface of the remaining part and the wire 5 are polished to expose the surface of wire 5 until having a predetermined thickness. Solder balls 6 are formed on the exposed and polished part of the wire 5.

However, in the BGA-type semiconductor device in FIGS. 1A and 1B, there are the problems that the cost for material becomes expensive because the wiring structure from the pad 2 to the solder ball 6 uses a polyimide tape 11 and the elastomer 10, and that the fabrication process is complicated because of the adhering structure.

Also, in the BGA-type semiconductor device in FIGS. 2A and 2B, there is the problem that the cost for material becomes expensive because the dummy support 15 is used.

SUMMARY OF THE INVENTION

Accordingly, it is an object of the invention to provide a mold-BGA-type semiconductor device where the connection with solder ball through wire can be made at a lower cost.

It is a further object of the invention to provide a method for making a mold-BGA-type semiconductor device where the connection with solder ball through wire can be made at a lower cost.

According to the invention, a mold-BGA-type semiconductor device, comprises:

a semiconductor chip which includes insulating resin film formed on at least a part of the surface of the semiconductor chip except a pad;

a conductive layer formed in a region on the insulating resin film, the region including at least part corresponding to a position where a solder ball is mounted;

a first metal thin wire which is wire-bonded between the pad and the conductive layer;

a second metal thin wire which is wire-bonded on the conductive layer;

resin part which seals the semiconductor chip, the resin part including a hole to expose part of the second metal thin wire; and a solder ball which is mounted on the hole.

According to another aspect of the invention, a method for making a mold-BGA-type semiconductor device, comprises the steps of:

forming insulating resin film on at least a part of the surface of a semiconductor chip except a pad;

wire-bonding between the pad and the conductive layer and wire-bonding on the conductive layer;

resin-sealing the semiconductor chip;

forming a hole through the sealing resin to expose part of a metal thin wire which is wire-bonded on the conductive layer; and mounting a solder ball on the hole.

BRIEF DESCRIPTION OF THE DRAWINGS

The invention will be explained in more detail in conjunction with the appended drawings, wherein:

FIGS. 4A to 4F are cross sectional views showing a method for making a mold-BGA-type semiconductor device in a preferred embodiment according to the invention.

DESCRIPTION OF THE PREFERRED EMBODIMENTS

Figure 1A:
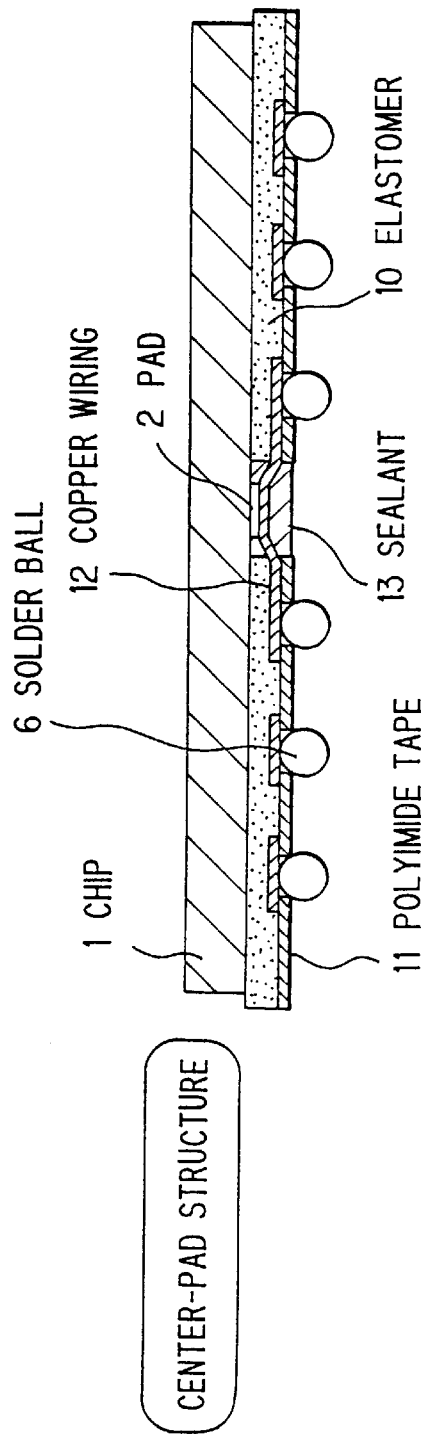
FIG. 1A is a cross sectional view showing a conventional center-pad-structured BGA-type semiconductor device.
Figure 1B:
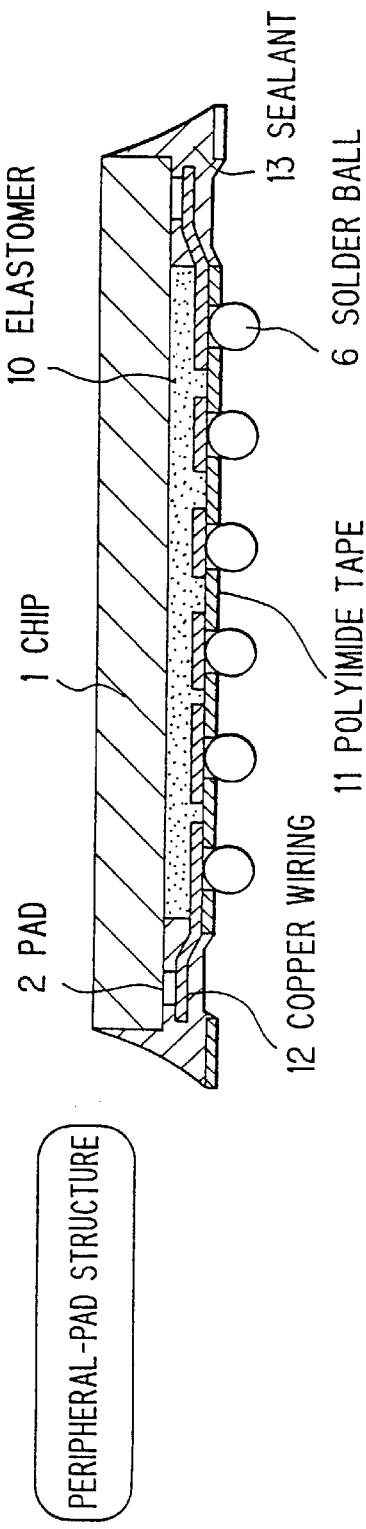
FIG. 1B is a cross sectional view showing a conventional peripheral-pad-structured BGA-type semiconductor device.
Figure 2A:
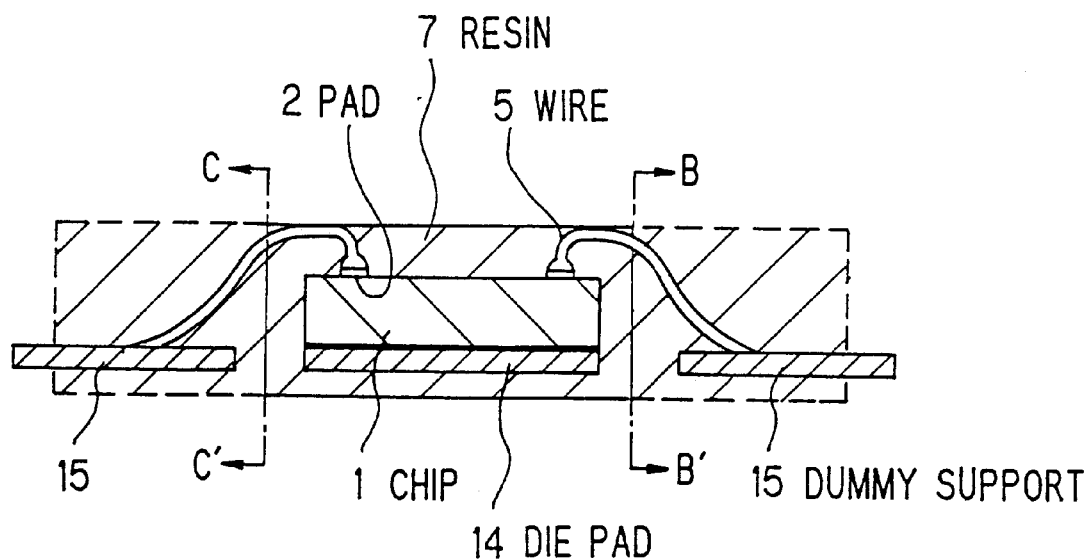
FIG. 2A and 2B are cross sectional views showing another conventional BGA-type semiconductor device and the fabrication process.
Figure 2B:
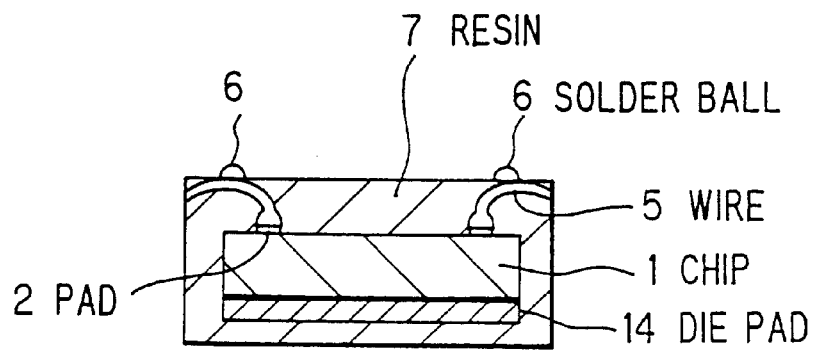

The preferred embodiments of the invention will be explained below, referring to the drawing.

Figure 3A:
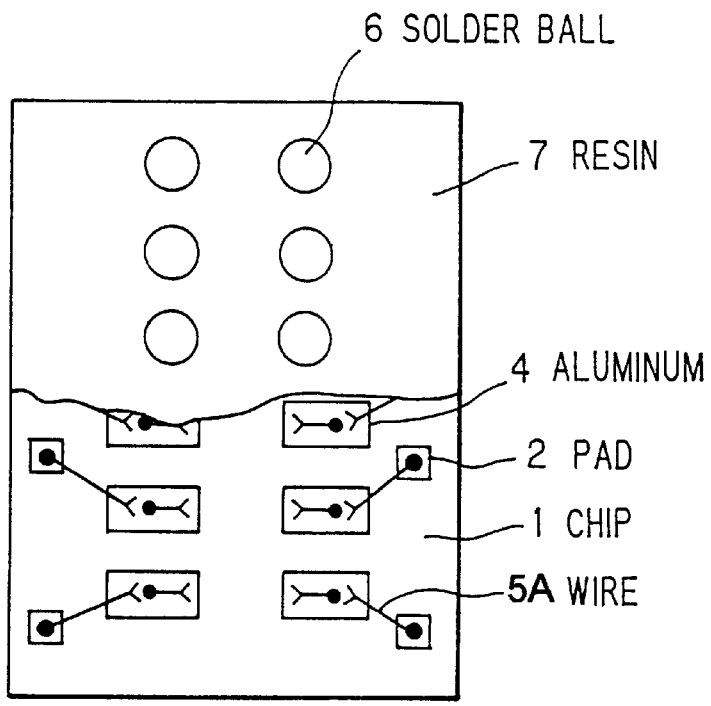
FIGS. 3A and 3B are a plan view and a cross sectional view showing a mold-BGA-type semiconductor device in a preferred embodiment according to the invention.
Figure 3B:
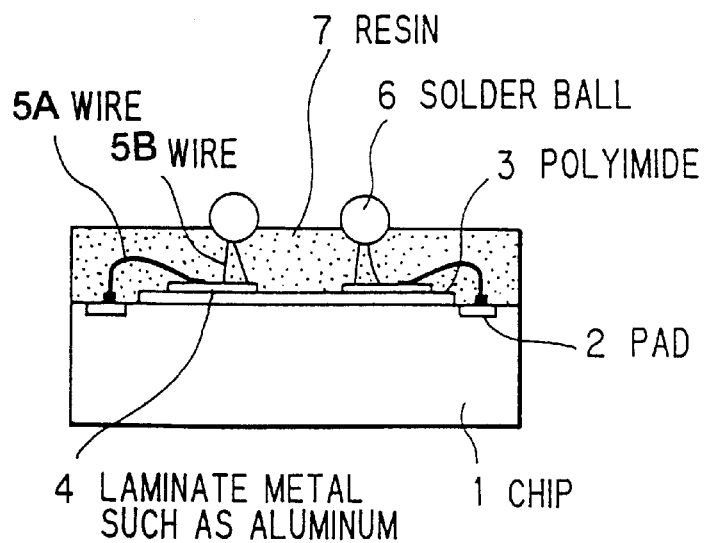

FIG. 3A is a plan view showing a mold-BGA-type semiconductor device, whose resin is partly removed, in the embodiment of the invention, and FIG. 3B is a cross sectional view of FIG. 3A.

As shown in FIGS. 3A and 3B, laminated metal layer 4, such as aluminum, is formed by vapor deposition etc. on polyimide film 3 formed on a chip 1, connected with a pad 2 by a wire (metal thin wire) 5A. Further, on the laminated metal layer 4, inverted-U-shaped wiring is provided. Solder balls 6 are bonded to the inverted-U-shaped wire exposed by holing resin 7 after sealing with resin 7.

Next, a method for making the above mold-BGA-type semiconductor device will be explained using FIGS. 4A to 4F.

First, as shown in FIG. 4A, polyimide 3 is formed on the surface of the chip 1, and aluminum 4 is vapor-deposited at part to dispose the solder ball 6.

As shown in FIG. 4B, wire bonding from the pad 2 to the aluminum layer 4 is conducted with the wire 5A. The position of the pad 2 is varied depending on a circuit on the chip 1. Therefore, wiring to the part to dispose the solder ball 6 is conducted with the wire 5B. Next, as shown in FIG. 4C, wire bonding is conducted on the aluminum layer 4.

Further, as shown in FIG. 4D, resin sealing is conducted with resin 7. Then, as shown in FIG. 4E, a solder-ball hole 9 is formed by laser light 8 to expose part of the wire 5B formed in FIG. 4C. The solder-ball hole 9 can be also exposed by polishing, but it can be exposed without hurting the wire when using laser light. Finally, as shown in FIG. 4F, the solder ball 6 is mounted on the solder-ball hole 9.

Advantages of the Invention:

As explained above, in the present invention, due to a conductive layer formed on insulating resin film of chip, the cost of material for wire-binding can be reduced, thereby making the semiconductor device at lower cost. Also, the bonding of solder ball and metal thin wire can be easily conducted.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A mold-BGA-type semiconductor device, comprising:

a semiconductor chip which includes insulating resin film formed on at least a part of the surface of the semiconductor chip except a pad;

a conductive layer formed in a region on said insulating resin film, said region including at least part corresponding to a position where a solder ball is mounted;

a first metal thin wire is wire-bonded between said pad and said conductive layer;

a second metal thin wire having a first end and a second end which is wire-bonded on said conductive layer; said second metal wire is substantially U-shaped, said first end and said second end of said metal wire are both wire bonded on said conductive layer;

resin part which seals said semiconductor chip, said first wire and partially seals said second wire, said resin part including a hole to expose part of said second metal thin wire for accommodating a solder ball; and a solder ball which is mounted on said hole.

2. A mold-BGA-type semiconductor device, according to claim 1, wherein:

said insulating resin film is polyimide film.

3. A mold-BGA-type semiconductor device, according to claim 1, wherein:

said conductive layer is an aluminum layer.

4. A mold-BGA-type semiconductor device, according to claim 2, wherein:

said conductive layer is an aluminum layer.

* * * * *